United States Patent [19]

Lindell

[11] Patent Number: 5,524,275
[45] Date of Patent: Jun. 4, 1996

[54] AVERAGED RF EXPOSURE CONTROL

[75] Inventor: Bo K. Lindell, Lidingo, Sweden

[73] Assignee: Ericsson GE Mobile Communications Inc., Research Triangle Park, N.C.

[21] Appl. No.: 168,151

[22] Filed: Dec. 17, 1993

[51] Int. Cl.⁶ ..................................................... H04B 1/04
[52] U.S. Cl. .......................... 455/117; 455/115; 455/127; 340/635
[58] Field of Search .................................... 455/127, 115, 455/117, 126; 340/635, 657

[56] References Cited

U.S. PATENT DOCUMENTS

| 4,034,297 | 7/1977 | Giorgi et al. | 455/117 |
|---|---|---|---|
| 4,114,108 | 9/1978 | Faulkenberry et al. | 455/117 |
| 4,165,493 | 8/1979 | Harrington | 330/207 P |
| 4,242,753 | 12/1980 | Dolikian et al. | 375/70 |
| 4,313,210 | 1/1982 | Hume et al. | 455/117 |
| 4,373,206 | 2/1983 | Suzuki et al. | 455/103 |
| 4,521,912 | 6/1985 | Franke et al. | 455/115 |
| 4,939,786 | 7/1990 | McCallum et al. | 455/67 |
| 5,193,212 | 3/1993 | Son | 455/38.3 |
| 5,241,690 | 8/1993 | Larsson et al. | 455/54.1 |

FOREIGN PATENT DOCUMENTS

| 2-39634 | 2/1990 | Japan . | |
|---|---|---|---|
| 1427578 | 9/1988 | U.S.S.R. . | |
| 2198912 | 6/1988 | United Kingdom | 455/79 |

OTHER PUBLICATIONS

"IEEE Standard for Safety Levels with Respect to Human Exposure to Radio Frequency Electromagnetic Fields, 3 kHz to 300 GHz," IEEE C95.1–1991, Institute of Electrical and Electronics Engineers, Inc., New York, N.Y., USA, Apr. 27, 1992.

Federal Communications Commission (FCC), Notice of Proposed Rulemaking, "Guidelines for Evaluating the Environmental Effects of Radiofrequency Radiation," ET Docket No. 93–62, Apr. 8, 1993, pp. 1–26.

Primary Examiner—Reinhard J. Eisenzopf
Assistant Examiner—Doris To
Attorney, Agent, or Firm—Burns, Doane, Swecker & Mathis

[57] ABSTRACT

A radio transmitter output power controller which automatically restricts the maximum transmitting time during an averaging time so that the average power remains below an acceptable level. Additionally or alternatively, the maximum transmitter output power may be automatically reduced to a lower level if and when a predetermined average power level is approached. A warning signal may be generated to inform a user that the maximum permitted power output is being approached.

11 Claims, 4 Drawing Sheets

AVERAGED RF EXPOSURE CONTROL

BACKGROUND OF THE INVENTION

1. Technical Field

The present invention relates to a method and apparatus for assuring that the average RF-exposure levels from radio transmitters, particularly cellular, hand-held radio telephones, do not exceed a predetermined level.

2. Background Art

In recent years there has been an increasing concern over the environmental effects of radio frequency radiation. For instance, the American National Standards Institute (ANSI) in association with the Institute of Electrical and Electronic Engineers, Inc. (IEEE) have adopted new standards for RF exposure. ANSI/IEEE C95.1-1992. The Federal Communications Commission (FCC) has proposed adopting these new guidelines. Notice of Proposed Rulemaking, "Guidelines for Evaluating the Environmental Effects of Radio frequency Radiation," ET Docket No. 93-62, Apr. 8, 1993.

The new guidelines are generally more restrictive than the previously adopted guidelines and encompass land-mobile systems, such as cellular radio, pocket and hand-held radio telephones. The guidelines provide for exclusions to the regulations if it can be shown through laboratory procedures that exposure conditions do not exceed a certain specific absorption rate (SAR) or, alternatively, if the radiated power is below a certain level. The FCC has proposed that hand-held devices such as cellular telephones must either comply with or be exempted from the requirements specified for uncontrolled environments.

The Maximum Permissible Exposure (MPE) for uncontrolled environments, the factors of which include electric field strength E (W/m), magnetic field strength H (A/m) and power density S (mW/cm$^2$), are related to the frequency range (MHz) of the radio signal. The averaging time, e.g., 6 or 30 minutes, for MPE under the new standard is also related to the frequency range of the radio signal. The RF exposure can be correlated to output power of a transmitter provided that environmental factors can be assumed, such as the transmitter radiating points being within a range of distance from a user (e.g., 2.5 cm from a user's head in a mobile telephone). Thus, the MPE can be correlated to a maximum permitted power.

Keeping within the guidelines by lowering the maximum power output to a level which cannot exceed the MPE at any instant may lead to unnecessary and undesirable results. For instance, in order to maintain a radio link, a mobile cellular transmitter may need to momentarily increase power output as the mobile transmitter passes obstructions in the path of the radio link. Exceeding a maximum power output would not, however, necessarily exceed the MPE because of the permitted averaging time.

SUMMARY OF THE INVENTION

The present invention is designed to assure that a transmitter does not exceed a MPE over the permitted averaging time while concurrently permitting a greater range of power output to maximize the transmitter's ability to broadcast at a level sufficient to establish or maintain a radio link.

An assurance that a radio system can not exceed the MPE will likely increase consumer confidence and thereby increase the marketability of products incorporating the present invention.

The present invention achieves these ends by automatically restricting the maximum transmitting time during a predetermined averaging time so that the average power remains below an acceptable level. Additionally or alternatively, the maximum transmitter output power can be automatically reduced to a lower level if and when a certain average power is approached. Further, a warning signal may be generated to inform a user that the MPE is being approached.

By implementation of this invention, higher power levels than the maximum power output that would otherwise be permitted without averaging can be used, thus increasing the quality and reliability of the radio link. Further, the present invention can be implemented in preexisting system designs through an easily made software modification or through a slight circuit modification, such as the inclusion of an integrator circuit.

The present invention thus avoids possible detrimental effects implied by the newly proposed power restrictions and assures users that the exposure guidelines, and particularly the MPE guidelines, cannot be exceeded by a device in accordance with the present invention. Also, radio transmitters incorporating the present invention can be exempted from the proposed FCC requirements.

BRIEF DESCRIPTION OF THE DRAWINGS

The present invention will now be described in detail with reference to the accompanying drawings wherein like elements are given like reference numbers, in which.

With reference to FIGS. 4–6, the rectilinear blocks represent states and the circles represent activities or events.

DETAILED DESCRIPTION OF THE PREFERRED EMBODIMENTS

Several examples of where and how the present invention can be implemented will be offered.

Handheld Simplex Radios

Figure 3:
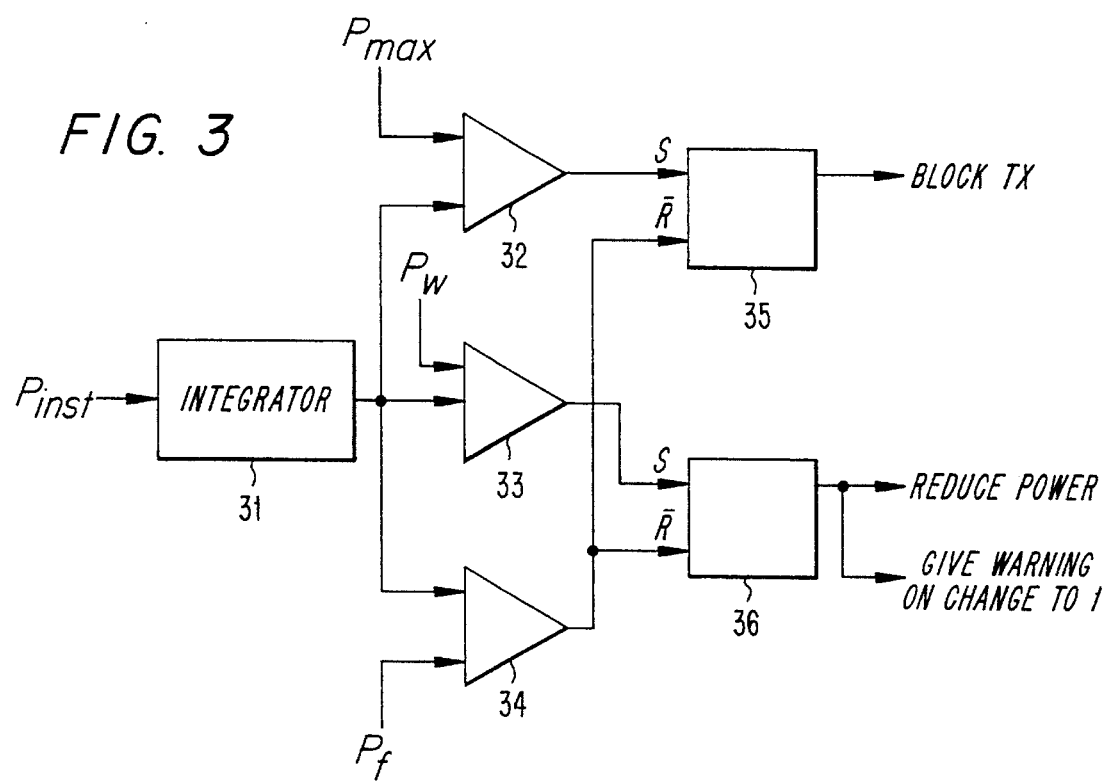
FIG. 3 is a functional diagram of a third embodiment of the present invention.

For purposes of illustration, with respect to professional handheld simplex radio systems, it is assumed that it has been found by measurements that allowed specific absorption rate (SAR) levels permit a continuous output over an averaging time of 1 W. During normal use of a handheld simplex radio, due to the customer usage profile, it can be expected that only a few short transmissions will take place during any six minute period, which corresponds to the permitted averaging time. However, a normal handheld radio for this system would preferably have 3 watt output power. This kind of system may use a transmitter timing control to limit any transmission period to one minute, for example. There is, however, no limit on the number of transmissions, so the average output power $P_{ave}$ might well approach or exceed the maximum allowed power $P_{max}$. In FIG. 3 the maximum allowed average power $P_{max}$ may be a digital or analog representation of decided maximum average power for cutting of the transmitter.

In this case a safety device in accordance with the present invention is useful. Such a safety device can take the form of an integrating circuit or a software equivalent thereof for estimating the average output power $P_{ave}$ during an averaging time $T_{ave}$, e.g., the last six minute period. The safety device will either stop or disable a transmission until a new transmission can take place without exceeding the maximum allowed power $P_{max}$, and/or give a warning that one more transmission is allowed, as explained further infra. Normal use will not cause radio links to be interrupted very often.

Burst Mode Transmitters

Another example is a burst mode transmitter where the duty cycle is usually low. In this case a high peak power can be used, and the safety device can delay transmissions when necessary without much influence on system performance, since interruptions will be rare.

Cellular Radio

The situation for cellular radios is different than handheld simplex or burst mode transmitters. The maximum power output is often in the order of 0.6 W. For purposes of illustration, it is assumed that it has been found that a certain type of cellular radio might be used continuously with 0.2 W output without exceeding the SAR limits. Normally cellular systems use power control depending on propagation conditions, hence the power of the mobile unit, for instance, will vary during use. In this case a warning signal could be given when a few minutes of transmission is allowed to continue at the same average power $P_{ave}$ as used during the averaging time $T_{ave}$, e.g., the last few minutes of the ongoing transmission. If the power limit $P_{max}$ is reached, the transmitter will be automatically switched off for a time period. A nuance can involve allowing at least one additional useful transmission (for a sufficient time) if the unit is manually switched on again.

Alternatively, the transmission power $P_{inst}$ could be reduced to a lower level at or shortly after the warning instant to permit non-interrupted (or at least a longer) transmission time. In FIG. 3 the instantaneous power $P_{inst}$ may be digital numerical value, or analog voltage representing actual transmitter output power. This is appropriate if there is margin in the normal power control system so that some additional reduction of power will only result in degradation of quality, not in total loss of communication.

Transmitter Cut-Off Embodiment

Figure 1:
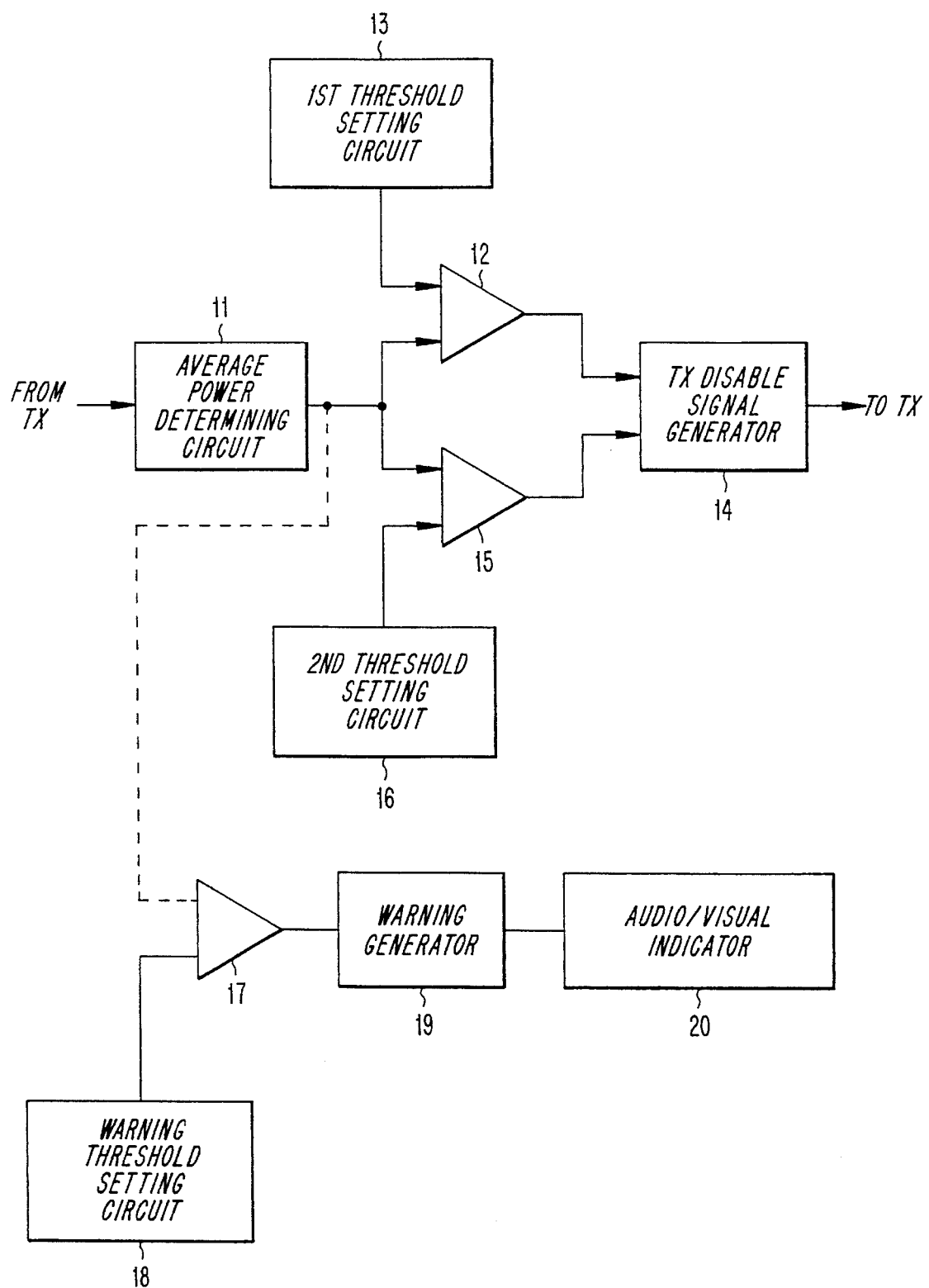
FIG. 1 is a functional diagram of a first embodiment of the present invention.
Figure 4:
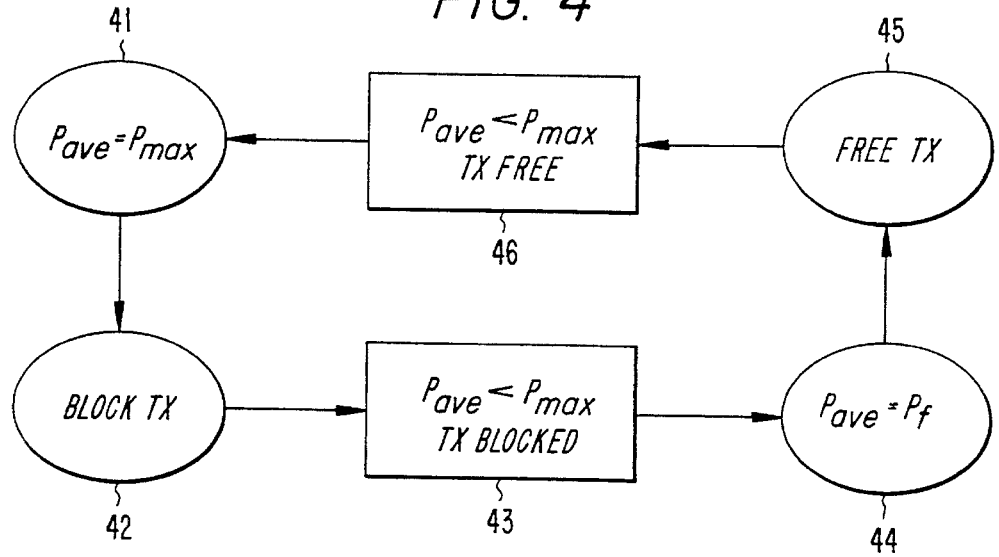
FIG. 4 is a program flow diagram of some of the features of the first embodiment of the present invention.

In a first embodiment illustrated in FIGS. 1 and 4, the invention acts analogously to a fuse wherein when the maximum power duration is exceeded, the transmission is simply shut-off. This embodiment is useful for most applications such as handheld simplex radios because the averaging time generally exceeds the typical duration of a radio link. Thus, the transmission power $P_{ave}$ never approaches the maximum output power $P_{max}$ as averaged over the averaging time $T_{ave}$. However, in rare instances wherein the reception conditions are particularly poor and/or the radio transmission link duration relatively long, the first embodiment of FIGS. 1 and 4 assures that the maximum transmission power cannot be exceeded. When the average power during the preceding averaging time (e.g., 6 minutes or 30 minutes) passes a threshold below or equal to the maximum power $P_{max}$ allowed by the MPE, the transmission is cut-off.

With reference to FIG. 1, an apparatus in accordance with this aspect of the present invention involves an average power determining circuit 11 for determining an average power by which a radio transmitter has transmitted during a preceding time period. This might take the form of an integrating circuit. The preceding time period may be the maximum averaging time $T_{ave}$ or a portion thereof. The average power determining circuit may determine, as a measure of average power $P_{ave}$, a maximum continuous transmission time based on past transmission time within an averaging time period $T_{ave}$ when the transmission power $P_{inst}$ is at a fixed level.

The apparatus also includes a comparator 12 for comparing the average power $P_{ave}$ to a first, predetermined threshold $P_{max}$. The first threshold may correspond to a maximum allowed average power $P_{max}$ for a given averaging time $T_{ave}$, which can be set by a first threshold setting circuit 13. The output of the comparator 12 activates a transmitter disable circuit 14 which disables the radio transmitter when the comparator 12 determines that the first threshold $P_{max}$ has been exceeded.

In addition to the above structure, the apparatus may include a second comparator 15 for comparing the average power $P_{ave}$ at which a radio transmitter has transmitted during a preceding time period $T_{ave}$ (including a time period in which the transmitter has been disabled) to a second predetermined threshold $P_f$. The second threshold $P_f$ is the average power $P_{ave}$ where power is restored and/or blocking is removed. The second threshold $P_f$ may correspond to a maximum allowed average power for a given averaging time $T_{ave}$ plus a margin sufficient to permit significant transmission time prior to re-exceeding the first threshold. In other words, an hysteresis effect is introduced to prevent rapid cycling of the power cut-off function. The second threshold $P_f$ may be set by a second threshold setting circuit 16.

The transmitter disabling circuit 14 may enable the resumption of radio transmission after being disabled when the average power $P_{ave}$ has diminished to be equal or be below the second threshold $P_f$.

The possible parameter settings thus include averaging time $T_{ave}$ and maximum allowed average power $P_{max}$, as well as the transmission re-enable threshold $P_f$. One additional possible parameter setting is the useful time $T_{use}$ which will be allowed prior to re-exceeding the maximum averaged power $P_{max}$.

In its simplest form with a fixed output power, the power cut-off criteria will be a measurement of what proportion of the past averaging time that has been used for transmission, and setting a maximum output time according to that proportion (e.g., setting a maximum output time to be the ratio of the allowed average power divided by the current output power).

These functions can be implemented through software or hardware. FIG. 4 is a flow diagram in accordance with an implementation of the present invention. In FIG. 4, the rectilinear blocks represent states, and the circles activities or events.

With reference to FIG. 4, the present invention is illustrated by the program flow diagram thereof. State 46 is the state where the transmitter can be used, e.g., be switched on. The average power $P_{ave}$ is below the maximum allowed average power $P_{max}$. In step 41, the average power $P_{ave}$ is determined to be greater than or equal to the maximum allowed power $P_{max}$. If it is greater, then transmission is blocked, as shown at step 42 resulting in the state 43. In state 43 the transmitter can no longer transmit, so the average power $P_{ave}$ will inevitably drop as time passes. Provided that the average power $P_{ave}$ is less than or greater than the maximum allowed power $P_{max}$ while the transmitter is blocked (state 43), then it is determined whether the average power $P_{ave}$ is less than or equal to a second threshold $P_f$, as shown in step 44. When the average power $P_{ave}$ drops below the second threshold $P_f$, then, as shown at step 45, the transmitter is re-enabled and therefore free to transmit. As shown in state 46, when the transmitter is free to transmit and the average power $P_{ave}$ is less than or equal to the maximum allowed power $P_{max}$ then the program return to step 41. Thus this aspect of the invention acts as a fuse to cut-off transmission and then re-enable transmission once the average power $P_{ave}$ drops below the maximum allowed power $P_{max}$ plus a margin as represented by the second threshold $P_f$.

This mechanism assures that the user will not be exposed to an average transmission power greater than permitted over the averaging time $T_{ave}$, while allowing renewed communication of an interrupted call as quickly as possible.

Thus, when average power $P_{ave}$ during past averaging time $T_{ave}$ has decreased below the limit $P_f$ by an amount that will allow some additional useful operating time $T_{use}$ at an expected power level, the transmitter can be re-activated after having been cut-off.

It is assumed that the transmitter is allowed to be turned on in its usual way, manually or through system request and not automatically, by a protective circuit in accordance with the present invention, when the past averaging time has decreased below the limit $P_f$.

An apparatus in accordance with the present invention may include a circuit or program for setting a threshold $P_f$ allowing the transmitter to be turned on when the average power $P_{ave}$ during the past time period $T_{ave}$ (decreasing) passes the threshold $P_f$, and estimating this threshold level $P_f$ from the expected power level $P_{exp}$ and a decided useful operating time $T_{use}$, and estimating the expected power level.

This embodiment may include a device for blocking the transmitter from being used when the average power $P_{ave}$ passes the allowed limit $P_{max}$. When the transmitter is blocked the average power necessarily goes down, since no more energy is integrated. When $P_{ave}$ passes the threshold $P_f$, the transmitter blocking is removed and the transmitter is allowed to be used again. The threshold $P_f$ is set to a value that will give some useful transmission time $T_{use}$, if the transmitter is switched on after removal of the blocking.

When the average power $P_{ave}$ is likely to exceed a predetermined limit $P_{max}$ if transmission is continued at expected power level $P_{exp}$ for more than a decided suitable time, a warning signal may be generated.

With reference to the phantom lines of FIG. 1, an apparatus suitable for implementing the invention can include the average power determining circuit 11 for determining an average power $P_{ave}$ by which a radio transmitter has transmitted during a preceding time period. The apparatus also includes a comparator 17 for comparing the average power $P_{ave}$ to an warning threshold $P_w$. The inventive apparatus may include warning threshold setting circuit 23 for setting the warning threshold $P_w$. The warning threshold $P_w$ may be a representation of decided level of average power $P_{ave}$ to give warning signal and/or to reduce transmitter power. The warning threshold setting circuit 18, in one embodiment, predicts when the average power is likely to exceed an allowed maximum average power $P_{max}$ according to the expected power level $P_{exp}$ and determine a warning threshold $P_w$ sufficiently below the permitted maximum average power $P_{max}$ output to allow an alarm to be generated within a predetermined time, such as a minute, prior to the transmitter exceeding the permitted maximum average power $P_{max}$, based on a result of the prediction. This allows the user to sign-off without or at least be forewarned of an abrupt interruption.

The inventive apparatus can include a warning generator 19 for generating a warning when the comparator determines that the warning threshold $P_w$ has been exceeded. The warning can be audio or visual or both.

Thus, one of the possible parameter settings is a suitable time prior to generating a warning signal the average power level $P_{ave}$ exceeding the warning threshold $P_w$.

A warning signal is initiated when and if the power passes the warning threshold $P_w$. If transmission is continued long enough, the transmitter will be blocked when $P_{max}$ is reached in this embodiment. The power decreases, and when $P_f$ is passed, the transmission blocking is removed. If transmission is stopped before $P_{max}$ is reached, the average power $P_{ave}$ will decrease without the transmitter being blocked.

Figure 5:
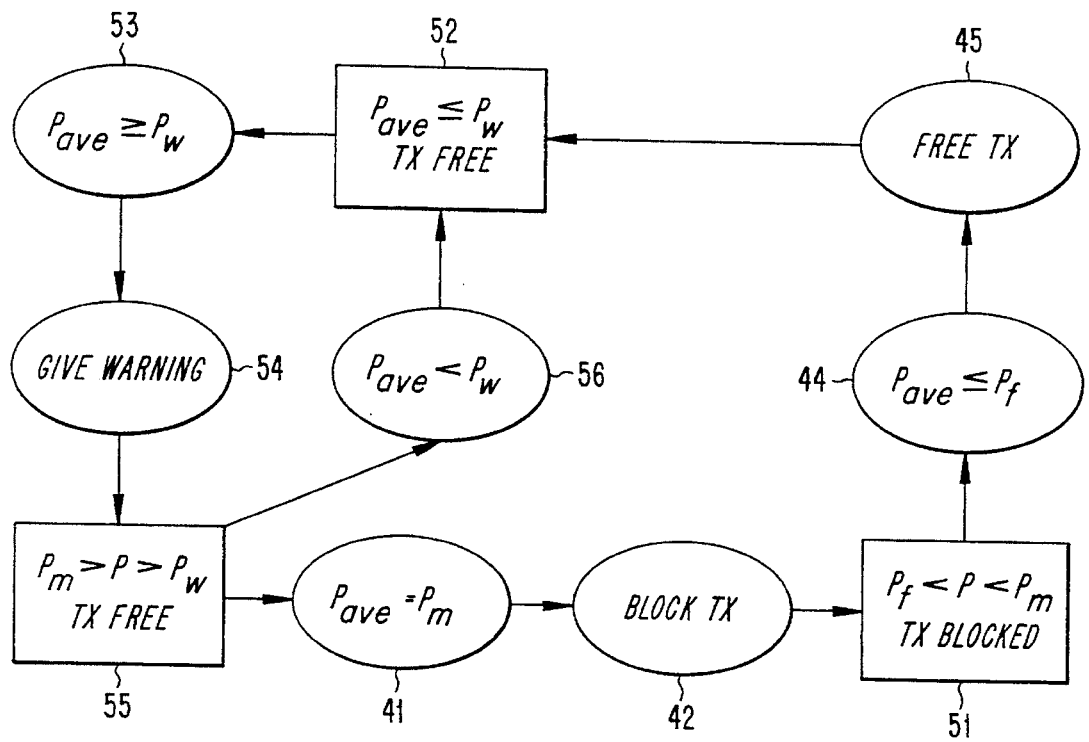
FIG. 5 is a program flow diagram of some additional features of the first embodiment of the present invention.

FIG. 5 shows a flow diagram illustrating an embodiment of this aspect of the present invention. This embodiment is similar to that shown in FIG. 4, wherein like steps are provided with like step reference numbers.

As shown in FIG. 5, in a state 52 when the average power is below a threshold value $P_w$ for generating warning and the transmitter is enabled, it is then determined whether the average power $P_{ave}$ equals or exceeds the warning threshold value $P_w$ at step 53. If the warning threshold $P_w$ is exceeded, then a warning is given, as shown at step 54. Step 55 shows a state where the average power $P_{ave}$ is between the maximum allowed power $P_{max}$ and the warning threshold $P_w$ while the transmitter is free. If the average allowed power $P_{ave}$ is below the warning threshold $P_w$, then the program flows to step 56, back to step 52 through step 53 and step 54. However, when the average power $P_{ave}$ equals the maximum allowed power $P_{max}$, as shown at step 41, then the transmitter is blocked as shown at step 42, thus resulting in the state 51 where the average power is between a first threshold $P_f$ for re-enabling the transmitter and the maximum allowed power $P_{max}$, while the transmitter is blocked. When the average power drops below the transmitter re-enabling the threshold $P_f$, as shown at step 54, then the transmitter is re-enabled, as shown at step 45 and the flow proceeds to step 52 to determine whether the average power is below or exceeds the warning threshold $P_w$.

A warning signal is thus initiated when and if the average power $P_f$ passes the warning threshold $P_w$. If the transmission is continued long enough, the transmitter will be blocked when the maximum allowed power $P_{max}$ is reached. When the average $P_{ave}$ decreases, and when the re-enabling threshold $P_f$ is passed, the transmitter blocking is removed. If the transmission is stopped before the maximum allowed power $P_{max}$ is reached, the average power $P_{ave}$ will decrease and the original state returns without the transmitter being blocked.

This warning can take any suitable form such as audio or visual indicators, or a combination of audio and visual indicators. Such indicators may optionally pulse and further may optionally pulse at an increasing rate as the predicted remaining transmission time grows short. Alternatively, the user can be informed of the actual, predicted time remaining by either an LCD display or by an artificially generated voice.

Figure 2:
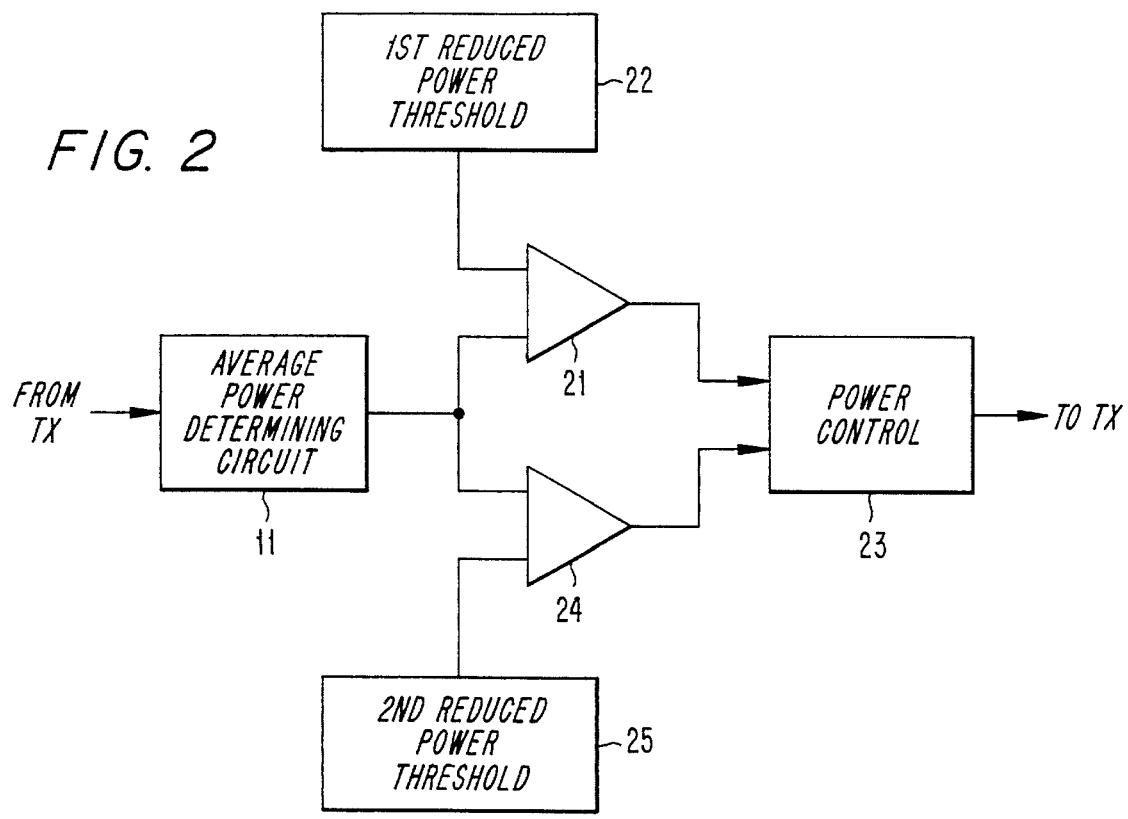
FIG. 2 is a functional diagram of a second embodiment of the present invention.

Another aspect of the present invention is power reduction, rather than simple power cut-off. The criteria for power reduction is the same as for generating a warning signal. With reference to FIG. 2, an apparatus in accordance with the present invention includes a circuit 11 for determining an average power $P_{ave}$ by which a radio transmitter has transmitted during a preceding time period $T_{ave}$, as in the embodiment of FIG. 1, and a comparator 21 for comparing the average power $P_{ave}$ to a first power reduction threshold $P_{R1}$. This embodiment includes a first reduced power threshold setting circuit 22 for setting the first power reduction threshold $P_{R1}$. The first reduced power threshold setting circuit 22 predicts when the average power is likely to exceed a maximum average power $P_{max}$ and determines a first power reduction threshold $P_{R1}$ sufficiently below the maximum average power $P_{max}$ to allow for power reduction within a predetermined time prior to the transmitter exceeding the maximum average power $P_{max}$, based on a result of the prediction.

This embodiment includes a power control 23 for reducing the maximum power at which the transmitter can transmit when the first comparator 21 determines that the first power reduction threshold $P_{R1}$ has been exceeded.

This embodiment may also include a second comparator 24 for comparing the average power $P_{ave}$ at which a radio transmitter has transmitted during a preceding time period $T_{ave}$ including a time period in which the transmitter maximum power output has been reduced, to a second predetermined reduced power threshold $P_{R2}$, and the power control 23 removes the reduced maximum power output restriction when the average power has diminished to equal or be below the second reduced power threshold $P_{R2}$. The second threshold $P_{R2}$ corresponds to the first power reduction threshold $P_{R1}$ plus a margin sufficient to permit significant transmission time prior to re-exceeding the first threshold $P_{R1}$. Also included may be a second reduced power threshold setting circuit 25 for setting the second threshold $P_{R2}$.

Thus a device implementing this aspect of the invention includes means for reducing power to suitable level (which will then be the expected level), estimating suitable level (which could be a fixed reduction in dB or a change of power level based on the level used which would be different for each level or range of levels).

Figure 6:
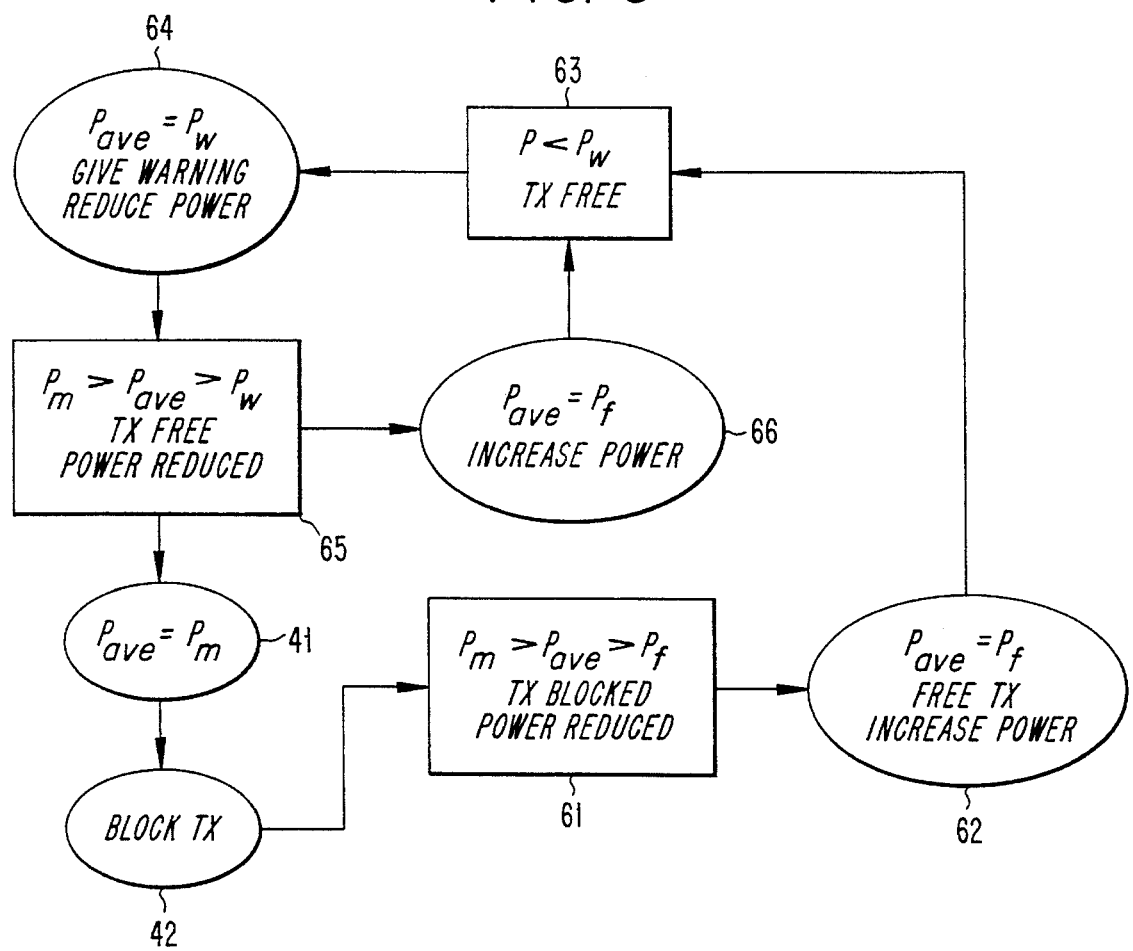
FIG. 6 is a program flow diagram of the second and third embodiment of the present invention.

FIG. 6 shows an embodiment of this aspect of the invention. In FIG. 6, steps analogous to those shown in FIGS. 4 and 5 are referred to by like reference numbers.

In the embodiment shown in FIG. 6, the transmission power is limited to a level which should not cause the average transmission power $P_{ave}$ to exceed the maximum permitted transmission power $P_{max}$. Thus, in the instance where the limited transmission power is insufficient for a clear radio communication link, the quality of the radio communication link may degrade or result in an interruption of the radio communication link when the quality drops below a minimum. However, some static on the communication link, for analog systems, or an increased bit error rate (BER) in digital systems, is deemed tolerable when offset against the advantages of assuring that the maximum average transmission power is not exceeded.

The criteria for removal of the power reduction is when estimated average power $P_{ave}$ will not exceed limit $P_{max}$ within suitable time if power returns to system setting. This is the same as above for resuming transmission capability in the first embodiment, but a full power range returns automatically.

Thresholds for warning $P_w$, power reduction $P_{R1}$, increase of power $P_{R2}$ and release of blocking $P_f$ can be set independently, giving slightly differing diagrams.

Reference will now be made to FIG. 6. FIG. 6 illustrates the embodiment where power reduction and automatic removal of power reduction is introduced. It should be noted that the threshold for power reduction $P_{R1}$ may be equal to the warning threshold $P_2$, as it is illustrated in FIG. 6. Thus, a warning can be generated in addition to the power reduction. Similarly, the increase in power threshold $P_{R2}$ and the release of transmission blocking threshold $P_f$ can be made equal. This is expedient, for instance, where both the power reduction function and the transmission blocking function are introduced into one embodiment, as will be discussed with reference to FIG. 3, infra. These assumptions simplify the illustration. However, if the parameters are made to be distinct, FIG. 6 would only be modified by adding appropriate states and activities.

In state 61 wherein the average power $P_{ave}$ is between the maximum allowed power $P_{max}$ and the first threshold $P_f$, while the transmitter is blocked and the power is reduced, it is determined whether the average power $P_{ave}$ has dropped to the first threshold $P_f$, whereupon the transmitter is no longer blocked and may transmit at the increased power levels, as shown at step 62. As shown at step 63, in a state where the transmitter is free to transmit and the average power $P_{ave}$ is below the warning threshold $P_w$, the program proceeds to step 64 where it is determined whether the average power equals or exceeds the warning threshold $P_w$ and thereupon generates a warning and reduces the maximum power $P_{max}$ at which the transmitter can transmit. Thereafter, at state 65 where the average power $P_{ave}$ is between the warning threshold $P_w$, and the maximum allowed power $P_{max}$, the transmitter is not blocked but broadcasts at a reduced power. In this state, as shown at step 66, if the average power drops below the first threshold $P_f$ the transmitter is permitted to transmit at an increased power level. By this step 66, the transmission is not interrupted. However, if the average power $P_{ave}$ equals the maximum allowed power $P_{max}$, as shown in step 41, then the transmission is blocked, as shown at state 62, and the program flow returns to step 61.

FIG. 3 shows another embodiment of the present invention which incorporates the features of the present invention including terminating transmission when a threshold corresponding to the maximum average power $P_{max}$ is reached, give a warning when a warning threshold is reached, and provide for power reduction as the maximum average power $P_{ave}$ is approached.

This embodiment includes an integrator 31 which receives a representation of the actual transmitter power $P_{inst}$ and a parameter setting representing the averaging time $T_{ave}$. The integrator 31 integrates the actual transmitter output power $P_{inst}$ over averaging $T_{ave}$ to output the average power $P_{ave}$. The average output $P_{ave}$ is input to three comparators 32, 33 and 34. The first comparator 32 determines if the average power $P_{ave}$ is greater than the decided maximum average power $P_{max}$ for cutting-off the transmitter. This maximum permitted power $P_{max}$ is a parameter which might be a constant or variable obtained through other processes but preferably corresponds to the MPE for a given set of conditions. The output of the comparator 32 is input to a flip-flop 35 which outputs a signal to block transmission. The flip-flop 35 may be an R/S flip-flop, or equivalent function in processor wherein B=1 will cut off the transmitter power of the transmitter, and B=0 permits normal transmitter on/off control.

A warning comparator 33 compares the average power $P_{ave}$ to a set warning parameter $P_w$ which corresponds to the threshold for generating a warning. The output of warning comparator 33 is input to a flip-flop 36, the output of which, when it changes from zero to one for instance, generates a warning signal. The flip-flop 36 may be an R/S flip-flop, or processor function wherein A=1 will reduce transmitter power, A=0 permits normal operation of system power control.

Because the warning threshold $P_w$ is set to the power reduction threshold $P_{R1}$, the flip-flop 56 can also serve to generate a signal to reduce the maximum power at which the transmitter is capable of transmitting. A power restoring comparator 34 compares the average power $P_{ave}$ to a parameter $P_f$ which is set at a threshold for restoring the transmitter power and/or removing the blocking of the transmission. The output of the power restoring comparator 34 is input to both the flip-flops 35 and 36 to effectively remove the transmission block and/or to remove the reduced power restriction.

The comparators 32, 33 and 34 are analog devices giving high output (=1) if the indicated condition is valid, low output (=0) if not. With digital implementation comparing may be done with processor software.

The average power determining circuit 11 and integrator 31 may be analog or digital circuit or software integrating instantaneous $P_{inst}$ over time $T_{ave}$ to give a measure of average power $P_{ave}$ as output.

The parameter $T_{ave}$, $P_{max}$, $P_w$, $P_f$ may be constants or variables obtained from other processes.

If an integrator is used, the integrator 31 performs the operation:

$$P_{ave}(t) = \int_{t-T_{ave}}^{t} P_{inst}(u)du$$

This can be achieved in a multitude of ways such as in a program of a processor.

A processor should sample $P_{inst}$ at intervals commensurate with the expected duration of transmissions in the system. One second intervals is probably sufficient for voice systems, to give good accuracy in $P_{ave}$.

The program would store the last number of samples of $P_{inst}$ and present the sum as output representing average power $P_{ave}$. The number of samples equals the averaging time $T_{ave}$ divided by the sampling period time. The output can be scaled to the same scale as $P_{inst}$ by dividing the output by the number of samples.

In a simple embodiment, if the transmitter has only one power level the integrator might take the form of a shift register, storing a "one" at every time sample the transmitter is on and a "zero" when it is not transmitting. The contents of "ones" in the register will represent $P_{ave}$. The length of the shift register equals the number of samples during the average sampling time $T_{ave}$.

The parameter setting for giving a warning $T_w$, is calculated at the remaining transmission time at expected average power level $P_{exp}$ before cut-off (cut-off at $P_{max}$). The warning time $T_w$ corresponds to the expected duration of transmission before cut-off after warning signal.

$$P_{max} = P_w + \frac{P_{exp}T_w}{T_{ave}}$$

$$P_w = P_{max} - \frac{P_{exp}T_w}{T_{ave}}$$

This suggested $P_w$ is a conservative estimate, taking into account that the averaging time could contain a long beginning period with $P_{inst}=0$.

A more exact algorithm will take into account that the integrated power during the first of the integrating time $T_{ave}$ will disappear from the integrator during the time $T_w$ following the warning signal. This requires an additional integrator with an averaging time of $T_{ave}-T_w$ and little seems to be gained.

With a constant transmitter power, the warning threshold $P_w$ is also a constant ($T_w$ considered as a fixed time).

The expected power $P_{exp}$ is simply $P_{inst}$ if the power is constant (only one power level available). In a radio with system power control, $P_{exp}$ is obtained by reducing the system demanded power level by a decided amount.

The power resume threshold $P_f$ can be set to a value less than what the warning threshold $P_w$ would be with maximum $P_{exp}$. This means that a new warning signal will be given when $P_w$ is approached.

Transmitter power $P_{inst}$ can be obtained from an output power meter or with sufficient margin from the system power control block, or in a simple system from the maximum power rating of the transmitter.

The foregoing description of the specific embodiments reveal the general nature of the invention and others can readily modify and/or adapt for various applications such specific embodiments without departing from the general concept, and, therefore, such adaptations and modifications should and are intended to be comprehended within the meaning and range of equivalents of the disclosed embodiments. It is to be understood that the phraseology and terminology employed herein is for the purpose of description and not limitation. Also, the plural includes the singular and the singular includes the plural, unless otherwise indicated.

I claim:

1. An apparatus comprising:

means for determining a total energy that a radio transmitter has transmitted during a preceding time period;

first means for comparing said total energy to a first predetermined threshold;

means for disabling said radio transmitter when said comparing means determines that said first threshold has been exceeded;

second means for comparing said total energy at which said radio transmitter has transmitted during said preceding time period, including a time period in which said transmitter has been disabled, to a second predetermined threshold; and means for enabling the resumption of radio transmission after being disabled when said total energy has diminished to a level not greater than said second threshold.

2. An apparatus in accordance with claim 1, further comprising means for setting said first threshold.

3. An apparatus in accordance with claim 1, wherein said first threshold corresponds to a maximum allowed total energy for a given time period.

4. An apparatus in accordance with claim 1, wherein said means for determining said total energy includes means for determining a maximum continuous transmission time based on past transmission time within said preceding time period as a measure of said total energy.

5. An apparatus in accordance with claim 1, wherein said second threshold corresponds to a maximum allowed total energy for a given time period plus a margin sufficient to permit significant transmission time prior to re-exceeding said first threshold which corresponds to said maximum allowed total energy for said given time period.

6. An apparatus in accordance with claim 1, further comprising means for setting said second threshold.

7. An apparatus comprising:
 means for determining a total energy a radio transmitter has transmitted during a preceding time period;
 means for comparing said total energy to a warning threshold;
 means for generating an alarm when said comparing means determines that said warning threshold has been exceeded; and
 means for setting said warning threshold, wherein said warning threshold setting means includes:
 means for predicting when said total energy is likely to exceed a permitted maximum total energy output level; and
 means for determining said warning threshold sufficiently below said permitted maximum total energy output level to allow said alarm to be generated approximately a predetermined time prior to said transmitter exceeding said permitted maximum total energy output level, based on a result of said predicting means.

8. An apparatus comprising:
 means for determining a total energy a radio transmitter has transmitted during a preceding time period;
 means for comparing said total energy to a first total energy reduction threshold:
 means for reducing a maximum power level at which said transmitter can transmit when said comparing means determines that said first total energy reduction threshold has been exceeded; and
 means for setting said first total energy reduction threshold, wherein said first total energy reduction threshold setting means includes:
 means for predicting when said total energy is likely to exceed a permitted maximum total energy output level; and
 means for determining said first total energy reduction threshold sufficiently below said permitted maximum total energy output level to allow for power reduction at approximately a predetermined time prior to said transmitter exceeding said permitted maximum total energy output level, based on a result of said prediction means.

9. An apparatus comprising:
 means for determining a total energy a radio transmitter has transmitted during a preceding time period;
 means for comparing said total energy to a first total energy reduction threshold;
 means for reducing a maximum power level at which said transmitter can transmit when said comparing means determines that said first total energy, reduction threshold has been exceeded;
 means for comparing said total energy at which a radio transmitter has transmitted during said preceding time period, including a time period in which said transmitter power output has been reduced, to a second predetermined reduced total energy threshold; and
 means for removing said reduced maximum total energy output restriction when said total energy has diminished to be not greater than said second reduced total energy threshold, said second reduced total energy threshold being lower than said first total energy reduction threshold.

10. An apparatus in accordance with claim 9, wherein said second reduced total energy threshold corresponds to said first total energy reduction threshold plus a margin sufficient to permit significant transmission time prior to re-exceeding said first total energy reduction threshold.

11. An apparatus in accordance with claim 9, further comprising means for setting said second threshold.

* * * * *